United States Patent
Sato

(10) Patent No.: US 7,714,389 B2
(45) Date of Patent: May 11, 2010

(54) SEMICONDUCTOR DEVICE HAVING TWO BIPOLAR TRANSISTORS CONSTITUTING ELECTROSTATIC PROTECTIVE ELEMENT

(75) Inventor: Masaharu Sato, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 6 days.

(21) Appl. No.: 12/289,267

(22) Filed: Oct. 23, 2008

(65) Prior Publication Data

US 2009/0108406 A1    Apr. 30, 2009

(30) Foreign Application Priority Data

Oct. 29, 2007    (JP)    .............................. 2007-279968

(51) Int. Cl.
    *H01L 23/62*    (2006.01)
(52) U.S. Cl. ....................... 257/355; 257/566; 257/567; 257/E27.028
(58) Field of Classification Search ................. 257/566, 257/567, 355, 546, 176, E27.028
    See application file for complete search history.

(56) References Cited

U.S. PATENT DOCUMENTS

| 5,920,107 A | 7/1999 | Kinoshita |
| 6,441,437 B1 * | 8/2002 | Gossner ...................... 257/355 |

FOREIGN PATENT DOCUMENTS

| JP | 1-287954 | 11/1989 |
| JP | 9-293798 | 11/1997 |

* cited by examiner

*Primary Examiner*—Zandra Smith
*Assistant Examiner*—Paul E Patton
(74) *Attorney, Agent, or Firm*—McGinn IP Law Group, PLLC

(57) ABSTRACT

A semiconductor device includes a pair of transistors formed in a first conductive type semiconductor substrate. Each of the transistors contains a collector region of a second conductive type, opposite to the first conductive type, formed in the semiconductor substrate, a base region of the first conductive type formed in the collector region, and an emitter region of the second conductive type formed in the base region, the collector region of one transistor of the pair of transistors being separated from that of the other transistor. The semiconductor device further includes a first region of the first conductive type formed between the collector regions of the pair of transistors, and a buried layer of the second conductive type formed in the semiconductor substrate under the collector region of one transistor of the pair of transistors to connect the collector regions of the transistors therethrough.

7 Claims, 7 Drawing Sheets

SEMICONDUCTOR DEVICE HAVING TWO BIPOLAR TRANSISTORS CONSTITUTING ELECTROSTATIC PROTECTIVE ELEMENT

BACKGROUND OF THE INVENTION

1. Field of the Invention

The present invention relates to a semiconductor device.

2. Description of Related Art

There has been used a semiconductor device provided with two bipolar transistors as an electrostatic protective element that protects object circuit elements from an overvoltage applied to its terminal.

For example, the patent document 1 (Japanese Unexamined Patent Application Publication No. Hei1(1989)-287954) discloses such a semiconductor device (electrostatic protective element) 400 as shown in FIG. 8.

This semiconductor device 400 has an N type diffusion region 403 as a collector region, as well as two P type diffusion regions 404 and 405 formed in this N type diffusion region 403. The P type diffusion regions 404 and 405 are base regions. In those P type diffusion regions 404 and 405 are formed N type layers 406 and 407 as emitter regions.

In the semiconductor device 400 as described above, if a voltage is applied to its input terminal, then the diode functions forward between the base region (P type diffusion region 405) and the collector region (N type diffusion region 403) of one transistor 402. In the other transistor 401, the bias is reversed between the base region (P type diffusion region 404) and the collector region (N type diffusion region 403). If a voltage applied to the other transistor 401 is over the withstand voltage between the base region and the collector region of the other transistor 401, then the transistor 401 is turned on and a current flows to the ground.

SUMMARY OF THE INVENTION

In case of the semiconductor device 400 described in the patent document 1, a parasitic PNP transistor Tr is formed by a base region (P type diffusion region 405), a collector region (N type diffusion region 403), and a base region (P type diffusion region 404).

If any noise is entered to the input terminal together with a voltage that is lower than the withstand voltage between the base region and the collector region of the transistor 401 at this time, then the PN bias is forwarded between the base region (P type diffusion region 405) and the collector region (N type diffusion region 403) of one transistor 402. At this time, as shown in FIG. 9, a parasitic capacitance C exists between the collector region (N type diffusion region 403) and the substrate, so a capacitance C charging current flows from the base region (P type diffusion region 405) to the collector region (N type diffusion region 403) of one transistor 402. This charging current is assumed as the base current of the parasitic transistor Tr. Consequently, the parasitic transistor Tr is turned on and the collector current of this parasitic transistor Tr comes to flow into the base region (P type diffusion region 404) of the other transistor 401. This current and the parasitic resistance of the base region (P type diffusion region 404) work together to generate a potential difference between the base region (P type diffusion region 404) and the emitter region (N type diffusion region 406), thereby a current comes to flow from the base region (P type diffusion region 404) to the emitter region (N type diffusion region 406) to turn on the other transistor 401. Turning on the other transistor 401 means turning on a thyristor between the base region (P) and the emitter region (N) of one transistor 402 and between the base region (P) and the emitter region (N) of the other transistor 401, respectively and a large current might be kept flowing from one transistor 402 to the other transistor 401 even when no noise is entered to the input terminal.

If any noise enters the input terminal in such a way, then the other transistor comes to malfunction even with a voltage lower than the original withstand voltage. In this case, therefore, the malfunction might affect the object internal circuit, for example, the internal circuit might malfunction.

In order to avoid such a problem of the conventional semiconductor device 400 shown in FIG. 8, there is a conceivable method, which forms a semiconductor device 200 as shown in FIGS. 5 and 6.

Because the semiconductor device 200 is provided with a collector pull-out region 201 of which impurity concentration is high, the device 200 can lower the gain of the parasitic transistor Tr. Consequently, if any low frequency noise as shown in FIG. 7 enters a signal line, then the parasitic capacitance C comes to be charged slowly, thereby the current flowing from the base region 202 to the collector region 203 of one transistor Q3 also decreases. And because the gain of the parasitic transistor Tr is also small, the current that has begun to flow after the parasitic transistor Tr is turned on reduces the potential difference to be generated between the base region 202 and the emitter region 204 of the other transistor Q4. As a result, the voltage Vt that enables the connection between the base region 202 and the emitter 204 is never exceeded. The other transistor Q4 can thus be prevented from being turned on by the parasitic transistor Tr.

However, if any high frequency noise as shown in FIG. 7 enters a signal line, then the parasitic capacitance C comes to be charged quickly, thereby increasing the current flowing from the base region 202 to the collector region 203 of one transistor Q3. In such a case, even when the parasitic transistor Tr is low in gain, the parasitic transistor Tr is turned on, thereby causing a current to flow and this flowing current increases the potential difference to be generated between the base region 202 and the emitter region 204 of the other transistor Q4. As a result, the other transistor Q4 is turned on.

Particularly, if the buried layer 205 is deep, then the concentration becomes low where the collector pull-out region 201 is deep, thereby the parasitic transistor Tr increases in gain and comes to be turned on at a low input voltage. This has also been a problem.

A semiconductor device of an exemplary aspect of the present invention includes a pair of transistors formed in a first conductive type semiconductor substrate. Each of the transistors contains a collector region of a second conductive type, opposite to the first conductive type, formed in the semiconductor substrate, a base region of the first conductive type formed in the collector region, and an emitter region of the second conductive type formed in the base region, the collector region of one of the pair of transistors being separated from that of the other transistor. The semiconductor device further includes a first region of the first conductive type formed between the collector regions of the pair of transistors, and a buried layer of the second conductive type formed in the semiconductor substrate under the collector region of one of the pair of transistors to connect the collector regions of the transistors therethrough.

Here, the first region may be connected to the semiconductor substrate or to the collector region electrically.

According to the aspect of the present invention, the first region is formed between the collector regions of the pair of transistors. Consequently, the base region, the collector region, and the first region of one transistor work together to form a parasitic transistor.

If any noise is applied to one of the paired transistors here, then a charging current flows from the base region to the collector region. This charging current becomes a base current of this parasitic transistor, and so the parasitic transistor comes to be turned on. However, if the first region of this parasitic transistor is connected to, for example, the GND or the like, then the current can be discharged.

Furthermore, if the first region of the parasitic transistor is kept connected to the collector region of one of the paired transistors, then the current that has begun flowing after the parasitic transistor is turned on is flown into the collector region, thereby the other of the paired transistors is prevented from influences by the parasitic transistor.

Consequently, the current is flown into the base region of the other transistor, thereby the other transistor can be prevented from being turned on. The other of the paired transistors can thus be prevented from the malfunction that might otherwise occur due to a voltage lower than the original withstand voltage.

In case of the present invention, the lower portions of the collector regions of the paired transistors are connected to each other through the buried layer formed in the semiconductor substrate.

If a positive overvoltage is applied to one of the paired transistors, then therefore, the bias is forwarded between the base region and the collector region of the transistor, thereby a current flows between those regions. This current passes through the buried layer into the collector region of the other transistor. Consequently, the present invention can prevent the current from flowing on the surface of the semiconductor layer of the semiconductor device, so the semiconductor is protected from damages. The semiconductor device can thus prevent its tolerance from degradation.

The patent document 2 (Japanese Unexamined Patent Application Publication No. Hei9(1997)-293798) discloses a semiconductor device 300 as shown in FIG. 10.

This semiconductor device 300 has a pair of NPN bipolar transistors. Between this pair of NPN transistors is formed an insulated isolation region 305. The semiconductor device 300 disclosed in the patent document 2 is not an electrostatic protective element. However, if the device 300 comes to be used as such an electrostatic protective element, then the collector regions 303 of the pair of the NPN bipolar transistors must be connected to each other through a wiring provided on the surface of the semiconductor device 300. In this case, a current comes to flow around the surface of the semiconductor device 300, so the semiconductor device 300 might be damaged at a high possibility and the tolerance of the semiconductor device 300 might thus be lowered.

In FIG. 10, reference numerals 301 and 302 denote a base region and an emitter region, respectively.

According to the present invention, therefore, it is possible to provide a semiconductor device capable of suppressing the tolerance from lowering and preventing malfunction when it is used as an electrostatic protective element.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
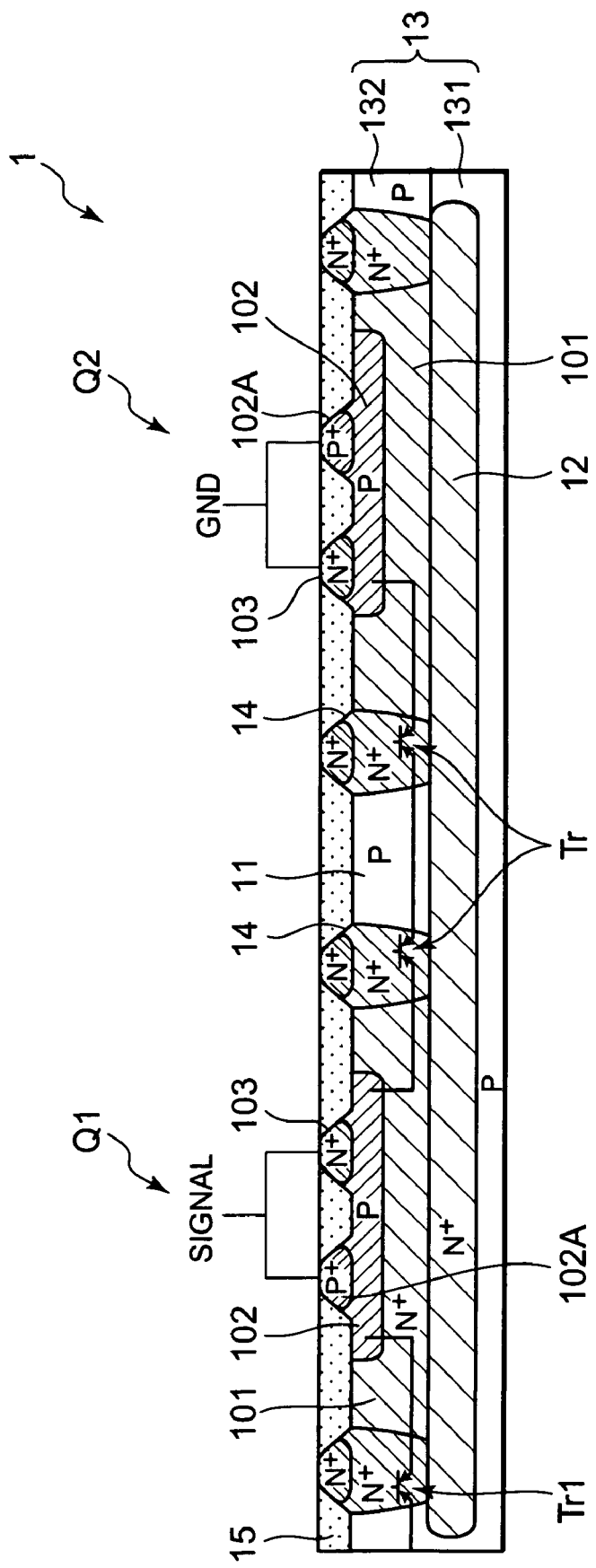
FIG. 1 is a cross sectional view of a semiconductor device in a first exemplary embodiment of the present invention.
Figure 2:
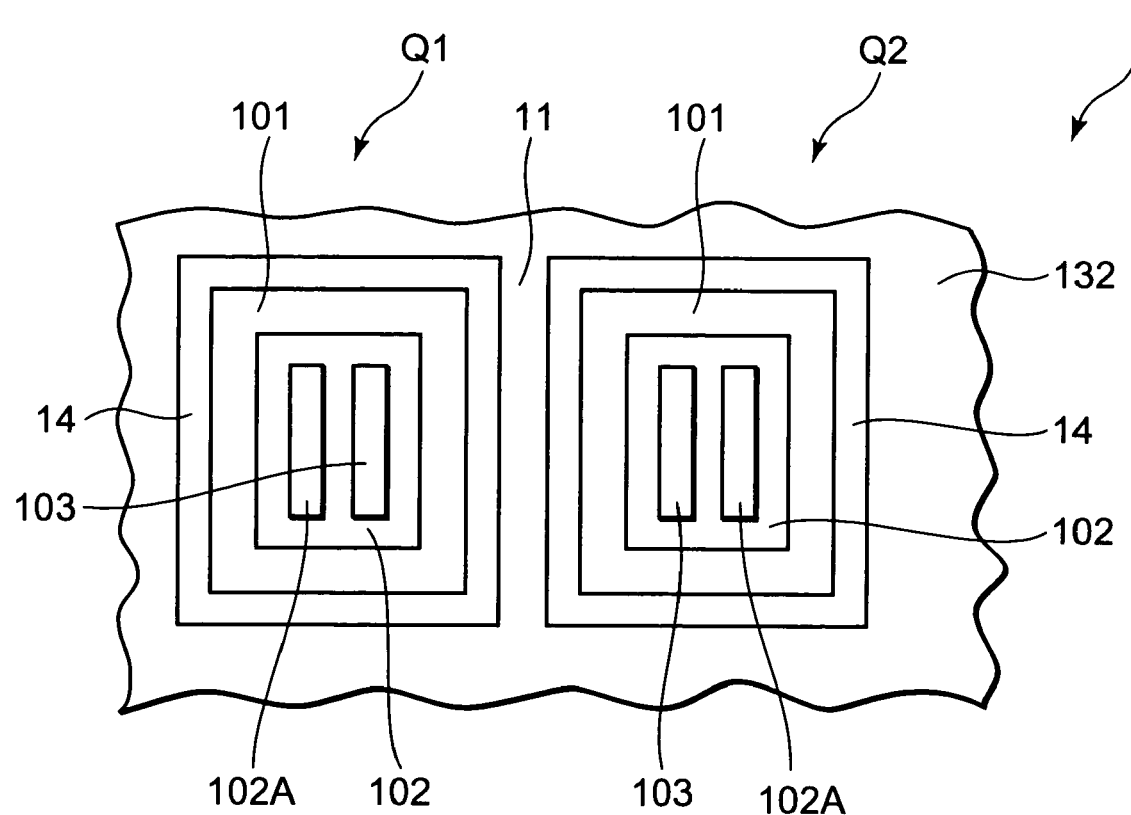
FIG. 2 is a top view of the semiconductor device.

FIGS. 1 and 2 show a first exemplary embodiment of the present invention.

The semiconductor device 1 in this first embodiment includes a first conductive type semiconductor substrate 13 having a pair of transistors Q1 and Q2 formed therein.

Each of the transistors Q1 and Q2 includes a second conductive type collector region 101, a first conductive type base region 102 formed in this collector region 101, and a second conductive type emitter region 103 formed in the base region 102. The first and second conductive types are opposite to each other in conductivity.

The collector regions of the transistors Q1 and Q2 are disposed separately from each other and a first conductive type first region 11 is formed between those collector regions of the transistors Q1 and Q2.

The lower portions of the collector regions of the transistors Q1 and Q2 reach a second conductive type buried layer 12 formed in the semiconductor substrate 13 and those collector regions 101 are connected to each other through this buried layer 12.

Next, there will be described in detail the semiconductor device 1 in this first exemplary embodiment.

The semiconductor device 1 functions as an electrostatic protective element. In addition to the semiconductor substrate 13, the transistors Q1 and Q2, the first region, and the buried layer 12 as described above, the device 1 also includes a collector pull-out region (third region) 14 and an oxide film 15 that separates each P type region from each N type region.

The semiconductor substrate 13 includes a P type basic substrate 131 and a P type epitaxial layer 132 stacked on this basic substrate 131.

In the epitaxial layer 132 are formed the pair of transistors Q1 and Q2.

The transistors Q1 and Q2 are bipolar transistors, each of which includes an N type collector region 101 formed in the epitaxial layer 132, a P type base region 102 formed in this collector region 101, and an N+ type emitter region 103 formed in the base region 102.

As shown in the top view of FIG. 2, the collector region 101, the base region 102, and the emitter region 103 are shaped as flat rectangles.

The oxide film 15 is omitted in the top view shown in FIG. 2.

The base region 102 includes a P+ type base contact region 102A formed on its surface. A signal line is connected to each of the base contact region 102A and the emitter region 103 of one (Q1) of the paired transistors. A ground line is connected to each of the base contact region 102A and the emitter region 103 of the other (Q2) of the paired transistors.

Furthermore, the collector regions 101 of the transistors Q1 and Q2 are separated from each other by a predetermined distance. Between this pair of collector regions 101 is formed a P type first region 11.

The first region 11 is formed between a pair of collector regions 101. As shown in FIG. 2, the first region 11 of the epitaxial layer 132 is connected to a P type region surrounding itself. In this exemplary embodiment, the first region 11 of the epitaxial layer 132 is formed unitarily with the P type region surrounding itself. When a pair of collector regions 101 is formed in the epitaxial layer 132, the region between the collector regions 101 is assumed as the first region 11.

In this exemplary embodiment, the first region 11 is disposed between the collector pull-out regions 14 surrounding the collector regions 101, respectively.

Each formed collector pull-out region 14, as shown in FIG. 2, is shaped like a ring surrounding one of the collector regions 101. This collector pull-out region 14 is an N+ type region and the N type impurity concentration of this region is higher than that of each collector region 101.

As shown in FIG. 1, the collector pull-out region 14 is the same as the collector region 101 in depth.

The collector pull-out region 14 is in contact with a collector region 101 directly and functions to connect a collector region 101 to a collector electrode (not shown).

The above described first region 11 is disposed between the collector pull-out regions 14 that face each other and it is in contact with those collector pull-out regions 14 directly.

The buried layer 12 is formed in the surface layer of the basic substrate 131 to cover the bottoms of the collector regions 101, the collector pull-out regions, and the first regions completely. The buried layer 12 is connected directly to the bottoms of the collector regions 101, the collector pull-out regions 14, and the first regions 11, respectively. The collector regions 101 are connected to each other through the buried layer 12.

This buried layer 12 is an N+ type one and its N type impurity concentration is higher than that of the collector region 101.

Figure 3:
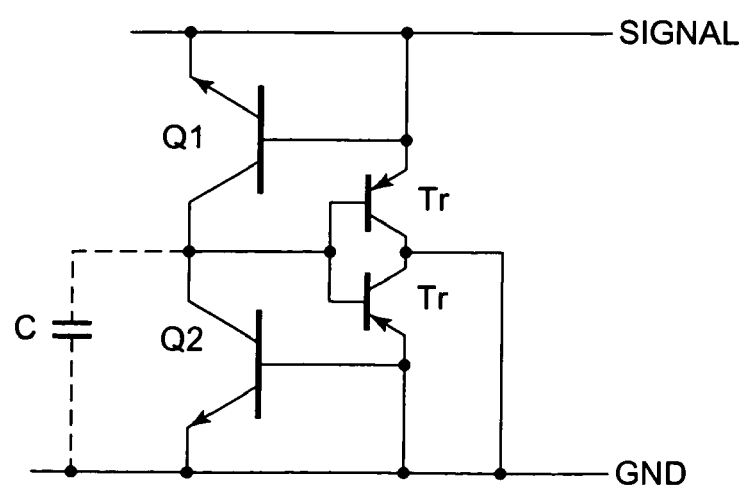
FIG. 3 is a circuit diagram of the semiconductor device.

Next, there will be described the operation of the semiconductor device 1 configured as described above with reference to FIGS. 1 and 3.

For example, assume now that some positive noise enters a signal line connected to the transistor Q1. The noise mentioned here means a voltage that is lower than a preset withstand voltage of the transistor Q2 and lower than an overvoltage (such as static electricity), which is capable of turning on the transistor Q2 when applied to the transistor Q2.

In this case, the noise is applied to the diode so that the diode functions forward between the base region 102 and the collector region 101 of the transistor Q1. Here, a parasitic capacitance C exists between the buried layer 12 that is in contact with the collector region 101 and the basic substrate 131. Consequently, the charging current flows from the base region 102 to the collector region 101.

On the other hand, the semiconductor device 1 also has a parasitic PNP transistor Tr that consists of the base region 102, the collector 101, the collector pull-out region 14, and the first region 11.

The above-described charging current is assumed as the base current of the parasitic PNP transistor Tr. The parasitic transistor Tr thus comes to be turned on. Here, the first region 11 is formed unitarily with the epitaxial layer 132, so when the parasitic PNP transistor Tr is turned on to generate a current, the current flows into the epitaxial layer 132 surrounding the first region 11 through the first region 11. The epitaxial layer 132 surrounding the first region 11 is in contact with the basic substrate 131, so the current flows into the basic substrate 131. Because the basic substrate 131 is grounded, the current flowing into the basic substrate 131 comes to be grounded accordingly. This means that the first region 11 is connected to the semiconductor substrate 13, so it is expected that the first region 11 has the same potential as that of the semiconductor substrate 13.

This is why the current never flows into the base region 102 of the other transistor Q2. Furthermore, no voltage that is over the withstand voltage between the base region 102 and the collector region 101 of the other transistor Q2 is applied to the transistor Q2. Thus, the transistor Q2 is not turned on.

On the other hand, if a positive overcurrent such as static electricity or the like is applied to a signal line connected to the transistor Q1, then the voltage is applied to the diode so that the diode functions forward between the base region 102 and the collector region 101 of the transistor Q1, thereby the potential of the collector region 101 of the transistor Q2 comes to rise through the buried layer 12. Then, the transistor Q2 comes to receive a voltage over the withstand voltage between the base region 102 and the collector region 101 thereof. As a result, the transistor Q2 is turned on. Because the transistor Q2 is connected to the ground line, the current that has begun flowing after the transistor Q2 is turned on is discharged to the ground, thereby the internal circuit is protected.

Even when such a positive overvoltage is applied to the transistor Q1, the parasitic transistor Tr is turned on. However, the current that has begun flowing after the parasitic PNP transistor Tr is turned on is also flown into the epitaxial layer 132, the basic substrate 131, and further into the ground through the first region. Thus, the current will not cause any problems.

Next, there will be described the effect to be obtained by the functions of this exemplary embodiment.

As described above, if any positive noise is inputted to a signal line connected to the transistor Q1, then a charging current flows from the base region 102 to the collector region 101. However, this charging current becomes the base current of the parasitic PNP transistor Tr. Consequently, the parasitic PNP transistor Tr comes to be turned on. Here, the first region 11 is formed unitarily (integrally) with the epitaxial layer 132, so the current that has begun flowing after the parasitic PNP transistor Tr is turned on is flown into the epitaxial layer 132 and further into the basic substrate 131 through the first region 11. Because the basic substrate 131 is grounded, the current flown into the basic substrate 131 is also flown into the ground.

This is why the transistor Q2 can be prevented from being turned on by noise. Thus, the transistor Q2 is prevented from malfunction that might otherwise occur due to a voltage lower than the withstand voltage of the device body, thereby the object internal circuit is protected from such influences.

The same effect can also be assured even when any negative noise is applied to the above signal.

The collector regions 101 of the transistors Q1 and Q2 are connected to each other at their bottoms through the buried layer 12.

If a positive overvoltage is applied to, for example, the transistor Q1, then the bias is forwarded between the base region 102 and the collector region 101, thereby a current flows between them. This current passes through the N+ type buried layer 12 and is flown into the collector region 101 of the transistor Q2. Consequently, the current is prevented from flowing on the surface of the semiconductor substrate of the semiconductor device 1, thereby the semiconductor device 1 is prevented from degradation of the tolerance.

The same effect will also be assured even when a negative overvoltage is applied to the above signal.

Furthermore, in this embodiment, a collector pull-out region 14 is provided so as to surround the collector region 101. This collector pull-out region 14 is an N+ region of which N type impurity concentration is higher than that of the collector region 101.

Consequently, the parasitic PNP transistor Tr gain can be lowered.

Furthermore, this embodiment also employs a parasitic PNP transistor consisting of the base region 102 of the transistor Q1, the buried layer 12, and the base region 102 of the transistor Q2.

However, because the buried layer 12 is an N+ layer of which N type impurity concentration is high, the parasitic transistor gain is suppressed low enough. The semiconductor device 1 will be hardly affected by the turning-on of this parasitic transistor.

Furthermore, as shown in FIG. 1, in addition to the parasitic PNP transistor Tr, this exemplary embodiment also employs another parasitic PNP transistor Tr1 including the base region 102, the collector region 101, the collector pull-out region 14, and the epitaxial layer 132. This parasitic PNP transistor Tr1 causes a current to be flown from the base region 102 into the epitaxial layer 132, then into the basic substrate 131. In this exemplary embodiment, the basic substrate 131 is grounded, so the current will not cause any problems as described above.

Second Exemplary Embodiment

Next, there will be described the second exemplary embodiment of the present invention with reference to FIG. 4.

In the first exemplary embodiment, the first region 11 is connected to a P type region of the epitaxial layer 132 and configured unitarily with the P type region.

Figure 4:
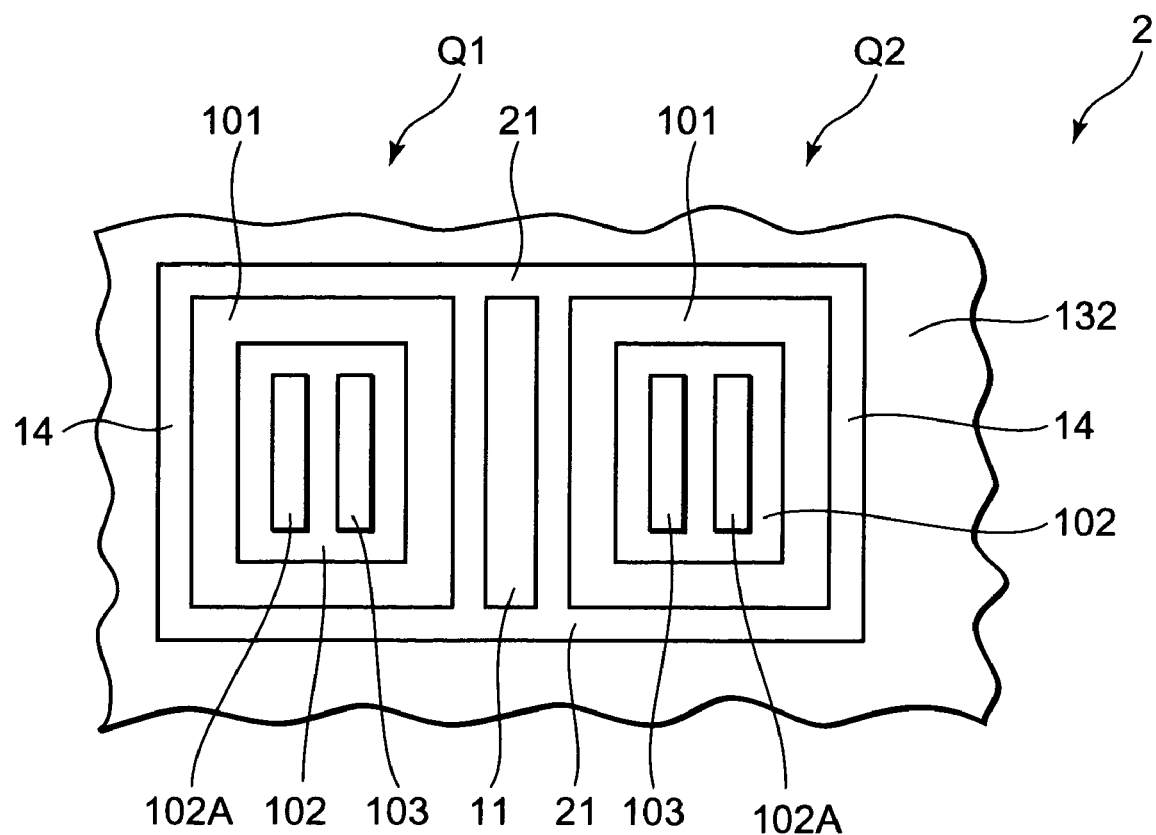
FIG. 4 is a top view of a semiconductor device in a second exemplary embodiment of the present invention.
Figure 5:
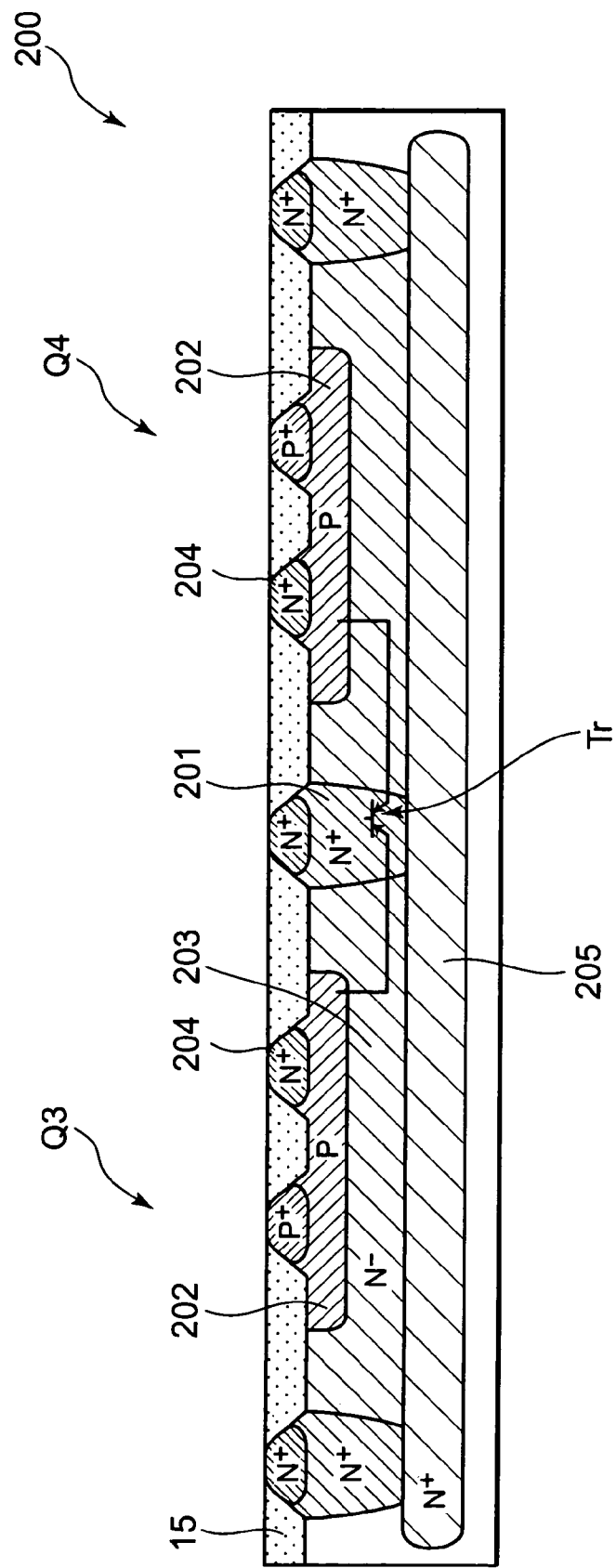
FIG. 5 is a cross sectional view of an improved version of a related semiconductor device.
Figure 6:
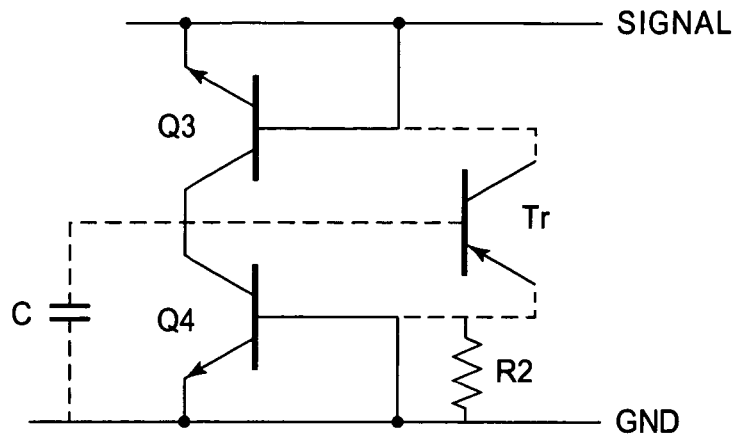
FIG. 6 is a circuit diagram of the semiconductor device shown in FIG. 5.
Figure 7:
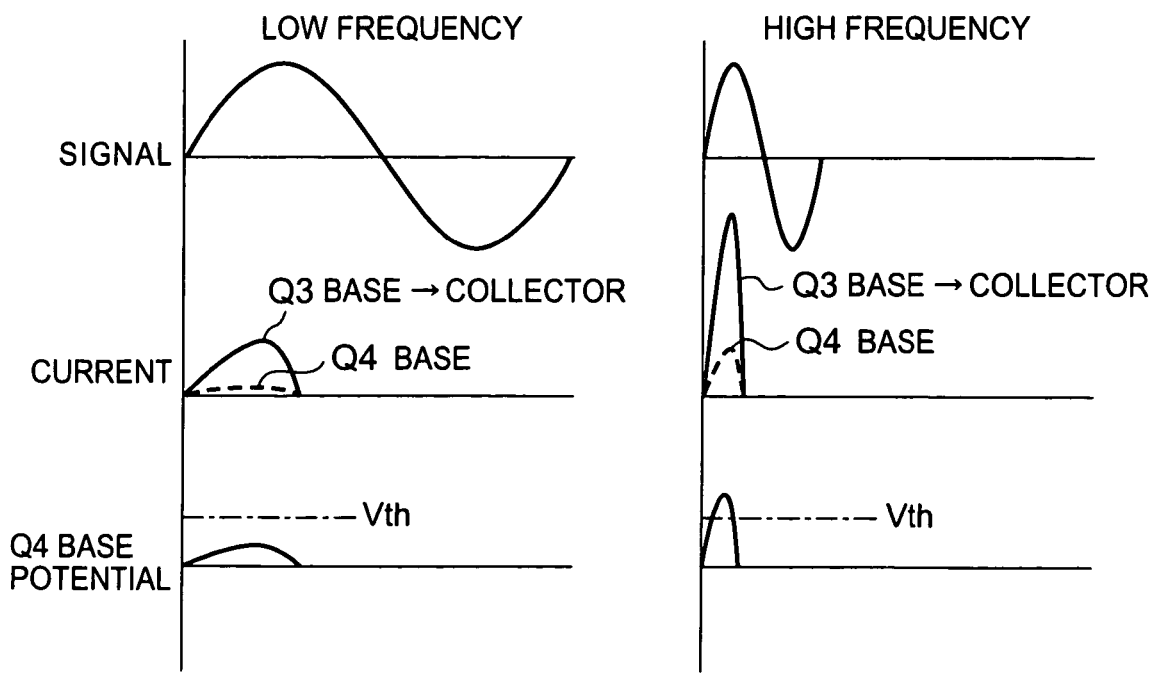
FIG. 7 is graphs showing the operation states of the semiconductor device shown in FIG. 5.
Figure 8:
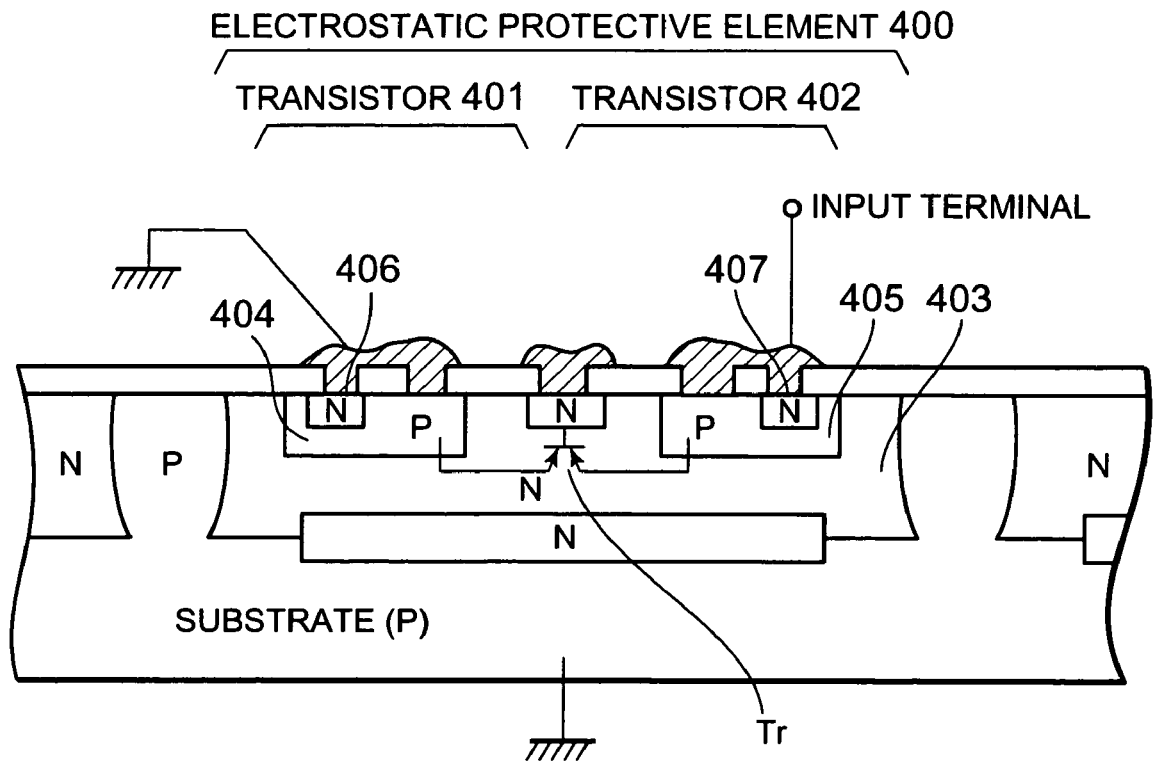
FIG. 8 is a cross sectional view of a related semiconductor device.
Figure 9:
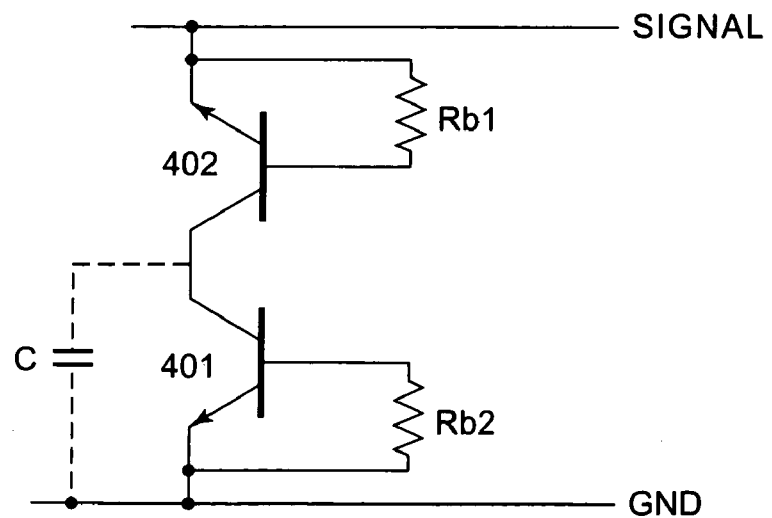
FIG. 9 is a circuit diagram of the related semiconductor device.
Figure 10:
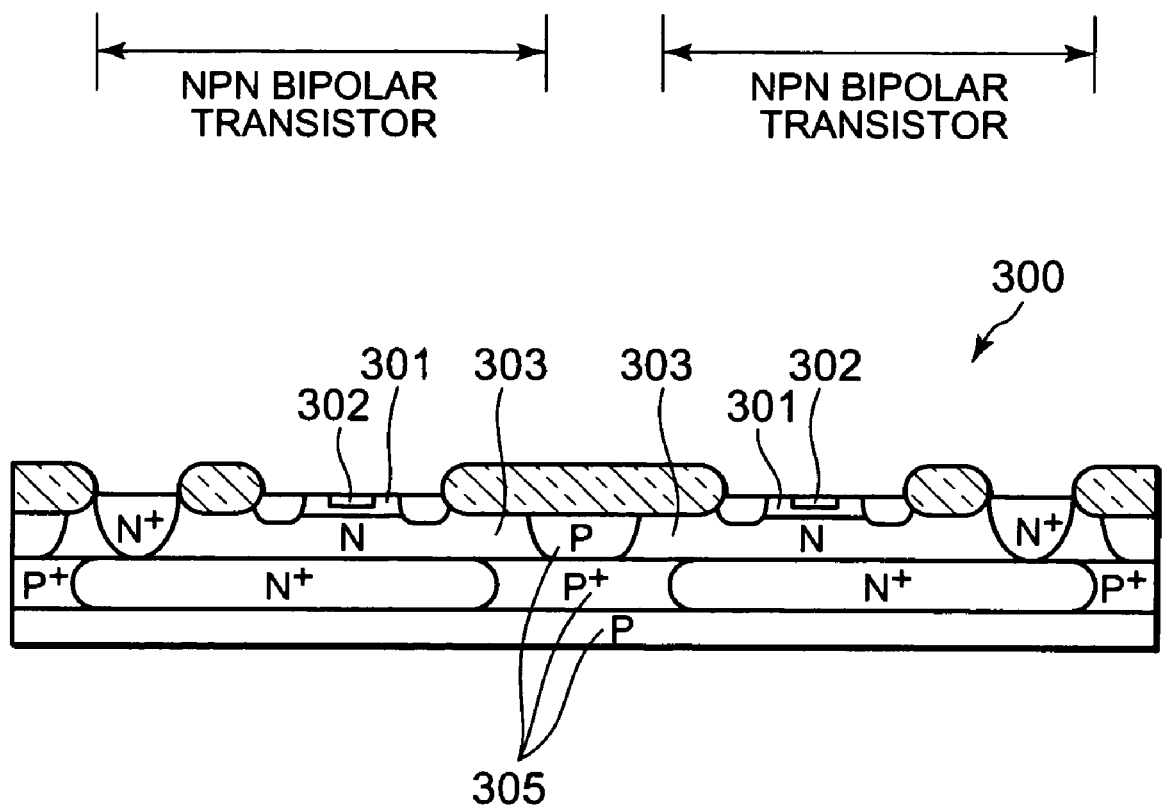
FIG. 10 is a cross sectional view of the semiconductor device disclosed in the patent document 2.

On the other hand, in case of the semiconductor device 2 in this second exemplary embodiment, as shown in the top view of FIG. 4, the first region 11 is surrounded by the collector pull-out region 14 and the second region 21. Furthermore, the first region 11 is separated from the P type region of the epitaxial layer 132.

More concretely, the second region 21 is in contact with a portion of the periphery of the first region 11, which is not in contact with the collector pull-out region 14. Concretely, the second region 21 is provided along two sides of the first region 11 that are facing each other.

This second region 21 is an N+ layer and its bottom reaches the buried layer 12 and is connected to the buried layer 12.

The first region 11 is completely separated from the P type region of the epitaxial layer 132 surrounding itself 11 due to this second region 21, the collector pull-out region 14, and the buried layer 12.

Also in this second exemplary embodiment, the first region 11 is electrically connected to the collector region 101 through a wiring (not shown). Consequently, in this second exemplary embodiment, the potential is the same between the first region 11 and the collector region 101.

According to this second exemplary embodiment, therefore, the same effect as that of the first embodiment can be assured. In addition, the following effect is also obtained.

In this second exemplary embodiment, the first region 11 is surrounded by the collector pull-out region 14, the second region 21, and the buried layer 12 and separated from the P type region of the epitaxial layer 132. The first region 11 is connected to the collector region 101. Consequently, the first region 11 comes to have the same potential as that of the collector region 101. Therefore, even when a current comes to flow into the collector even when the parasitic PNP transistor Tr is turned on. The influence from the parasitic PNP transistor Tr can thus be ignored.

Consequently, the transistor Q2 can be prevented from being turned on by noise.

Furthermore, as shown in FIG. 1, in addition to the parasitic PNP transistor Tr, this second exemplary embodiment also employs another parasitic PNP transistor Tr1 consisting of the base region 102, the collector region 101, the collector pull-out region 14, and the epitaxial layer 132. The gain of this parasitic PNP transistor Tr1 can be lowered with use of a collector pull-out region 14 of which impurity concentration is high. Consequently, it is prevented that a current flows from the base region 102 to the epitaxial layer 132, then into the basic substrate 131, thereby the potential fluctuation of the semiconductor substrate 13 can be suppressed.

While the exemplary forms of the present invention have been described, it is to be understood that modifications will be apparent to those skilled in the art without departing from the spirit of the invention.

For example, in each of the above described embodiments, the collector pull-out region 14 is formed so as to surround the collector region 101 and the impurity concentration of the region 101 is set higher than that of the region 101. The collector pull-out region 14 may be omitted, however.

In this case, the collector region 101 comes in contact with the first region directly.

In each of the above mentioned embodiments, transistors Q1, Q2 are formed to NPN transistors. However, they also may be formed to PNP transistors.

Furthermore, in each of the above described exemplary embodiments, the ground line is connected to the transistor Q2. However, a power line (Vdd) may be connected to the base region and the emitter region of the transistor Q2, respectively.

Further, it is noted that Applicant's intent is to encompass equivalents of all claim elements, even if amended later during prosecution.

What is claimed is:

1. A semiconductor device, comprising:
  a pair of transistors formed in a semiconductor substrate of a first conductive type, each of the transistors comprising:
    a collector region of a second conductive type, opposite to the first conductive type, formed in the semiconductor substrate;
    a base region of the first conductive type formed in the collector region;
    an emitter region of the second conductive type formed in the base region, the collector region of one transistor of the pair of transistors being separated from that of the other transistor;
    a first region of the first conductive type formed between the collector regions of the pair of transistors; and
    a buried layer of the second conductive type formed in the semiconductor substrate under the collector region of one transistor of the pair of transistors, to connect the collector regions of the transistors therethrough.

2. The semiconductor device according to claim 1, wherein the first region is connected to the semiconductor substrate and has a same potential as that of the semiconductor substrate.

3. The semiconductor device according to claim 1,
wherein the first region is connected to the collector region and has a same potential as that of the collector region.

4. The semiconductor device according to claim 3,
wherein the buried layer covers a bottom face of the first region completely, and
wherein the second region is formed so as to be adjacent to a portion included in a circumference of the first region and not between the collector regions, and so as to surround the first region together with each of the collector regions and formed to reach the buried layer.

5. The semiconductor device according to claim 1, further comprising:
a third region of the second conducive type formed so as to surround each of the collector regions and be connected to the buried layer, an impurity concentration of the third region being higher than that of each of the collector regions.

6. The semiconductor device according to claim 1, further comprising:
a signal line connected to the base and emitter regions of one transistor of the pair of transistors, respectively; and
a power line or ground line connected to the base and emitter regions of the other transistor, respectively.

7. A semiconductor device, comprising:
first and second transistors formed in a semiconductor substrate of a first conductive type, each of the first and second transistors comprising:
a collector region of a second conductive type, opposite to the first conductive type, formed in the semiconductor substrate;
a base region of the first conductive type formed in the collector region; and
an emitter region of the second conductive type formed in the base region, the collector region of the first transistor being separated from that of the second transistor;
means for, when a first noise, which has a voltage potential the same or less than a withstand voltage of the second transistor, is applied to an input terminal of the first transistor, evacuating a current generated by a parasitic transistor activated by the first noise to a ground potential; and
means for, when a second noise, which has a voltage potential larger than the withstand voltage of the second transistor, is applied to the input terminal of the first transistor, for responding to the second noise to increase a potential of the collector region of the second transistor so that the second transistor turns ON.

* * * * *